United States Patent [19]
Kuindersma et al.

[11] Patent Number: 5,191,590
[45] Date of Patent: Mar. 2, 1993

[54] SEMICONDUCTOR DIODE LASER WITH MONITOR DIODE

[75] Inventors: Pieter I. Kuindersma; Teunis Van Dongen; Gerardus L. A. H. Van Der Hofstad, all of Eindhoven; Marcellinus B. M. Kemp, Veldhoven, all of Netherlands

[73] Assignee: U.S. Philips Corp., New York, N.Y.

[21] Appl. No.: 824,815

[22] Filed: Jan. 21, 1992

[30] Foreign Application Priority Data

Jan. 23, 1991 [NL] Netherlands ............... 9100103

[51] Int. Cl.⁵ ............................................. H01S 3/19
[52] U.S. Cl. ....................................... 372/50; 372/20; 372/45; 372/96
[58] Field of Search ................. 372/50, 45, 96, 46, 372/20; 357/19

[56] References Cited

U.S. PATENT DOCUMENTS

| | | | |
|---|---|---|---|
| 4,653,058 | 3/1987 | Akiba et al. | 372/50 |
| 4,719,636 | 1/1988 | Yamaguchi | 372/50 |
| 4,788,690 | 11/1988 | Akiba et al. | 372/50 |
| 4,899,361 | 2/1990 | Numai | 372/50 |
| 4,920,542 | 4/1990 | Brosson et al. | 372/50 |
| 4,995,048 | 2/1991 | Kuindersma et al. | 372/50 |
| 5,088,097 | 2/1992 | Ono et al. | 372/20 |
| 5,119,393 | 6/1992 | Oka et al. | 372/50 |

Primary Examiner—Georgia Y. Epps
Attorney, Agent, or Firm—Steven R. Biren

[57] ABSTRACT

A semiconductor diode laser (1) with a monitor diode (2) includes a semiconductor body with a substrate (4) and a superimposed layer structure (5) having an active layer (6) and a pn junction (7) with which radiation (24) can be generated. The monitor diode (2) is separated from the diode laser by a groove (10) which extends into the substrate (4) and of which one of the walls forms an end face of the laser. The groove (10) and the monitor diode (2) are present at the side where the main radiation beam (24) emerges, while the active layer (6) extends over at most only a small portion, preferably at most 20%, of the length of the monitor diode (2). The length in the monitor diode over which absorption takes place is preferably smaller than the absorption length for the emitted laser radiation.

6 Claims, 1 Drawing Sheet

SEMICONDUCTOR DIODE LASER WITH MONITOR DIODE

BACKGROUND OF THE INVENTION

The invention relates to a semiconductor diode laser with a monitor diode, comprising a semiconductor body with a substrate region and a superimposed semiconductor layer structure comprising an active layer and a pn junction with which, provided there is a sufficiently strong current in the forward bias direction of the pn junction, coherent electromagnetic radiation can be generated in a strip-shaped active region of the active layer situated within a resonance cavity, which resonance cavity is bounded by two end faces which are substantially perpendicular to the active region, the radiation emerging through at least one of the end faces, while the monitor diode is formed by a portion of the semiconductor body which is separated from the diode laser by a groove which extends through the layer structure down to at least the substrate region and of which one of the walls forms an end face of the diode laser.

Such a semiconductor diode laser is described in U.S. Pat. No. 4,653,058.

Semiconductor laser diodes with a layer structure comprising a strip-shaped active region with a pn junction which produces laser radiation in a direction parallel to the pn junction when biased in the forward direction are known in various embodiments.

A monitor diode is generally used for keeping the intensity of the generated laser radiation constant or for varying it in a desired manner. This monitor diode, which is usually reverse-biased, is so positioned that at least part of the laser radiation is incident on it and is converted into an electrical signal. This signal is subsequently fed back to the laser supply and used for controlling the current through the diode laser, and thus the radiation intensity supplied by the laser, in the desired manner.

The monitor diode is usually positioned at the rear of the laser diode then, i.e. at the side facing away from the side where the useful laser radiation emerges, which side is called the front hereinafter. Sufficient radiation then issues through the rear mirror surface, which is partly reflecting, in order to control the monitor diode.

If the rear mirror is totally reflecting, however, the monitor diode cannot be positioned at the rear. Monitoring of the energy radiated through the rear is also either impossible or insufficient for achieving the set aim if during the laser life, or in the operating state, the intensity ratio between the "front" and the "rear" radiation changes. This may occur in particular in the case of re-tuning of tunable laser diodes, for example of the DBR (Distributed Bragg Reflection) type. In this case the monitor diode must be positioned in the light path of the main radiation beam emitted at the front. The monitor diode should also be provided at the front especially when the aim is to suppress noise in the useful laser radiation.

Such an arrangement of the monitor diode, however, has major disadvantages. The monitor diode may absorb a substantial portion of the radiation. Compensation of this through an increase of the current through the laser is not always possible without exceeding the maximum permissible laser current. In addition, the coupling of the laser radiation in the fibre optics may be seriously hampered or even become impossible in this monitor diode arrangement.

SUMMARY OF THE INVENTION

The invention has for its object inter alia to provide a semiconductor laser diode with a monitor diode which is positioned in the main radiation beam and absorbs only a small portion of the laser radiation, while a good coupling with the optical fiber is obtained.

According to the invention, a semiconductor laser diode of the kind described above is characterized in that the groove and the monitor diode are present at the side where the main radiation beam emerges and in that the active layer extends over at most only a small portion of the length of the monitor diode.

The invention is based inter alia on the recognition that it is possible to use a monitor diode with very low absorption when the electrical separation between laser diode and monitor diode is sufficiently great and that such a monitor diode may also have sufficiently large dimensions for the provision of satisfactory electrical contacts.

The invention is particularly effective when the length in the monitor diode over which absorption occurs is smaller than the absorption length for the laser radiation emitted. Absorption length is understood to mean the length over which the intensity of the radiation decreases by a factor 1/e, in which e is the base of the natural logarithm.

According to a preferred embodiment, the active layer extends over at most 20% of the length of the monitor diode. According to a further preferred embodiment, the active layer does not extend inside the monitor diode at all.

Another preferred embodiment is characterized in that the groove runs partly in the longitudinal direction of the diode laser and bounds a portion of the monitor diode on which a connection conductor is provided.

The invention may be advantageously used for all types of diode lasers of the kind described above. However, since a change in the ratio between "front" and "rear" radiation occurs in particular in tunable DBR lasers, as stated above, a further important preferred embodiment is characterized in that the diode laser is a tunable DBR laser.

BRIEF DESCRIPTION OF THE DRAWINGS

The invention will now be explained in more detail with reference to several embodiments and the drawing, in which.

The Figures are purely diagrammatic and not drawn to scale. Corresponding parts are generally given the same reference numerals in the Figures.

DESCRIPTION OF THE PREFERRED EMBODIMENTS

Figure 1:
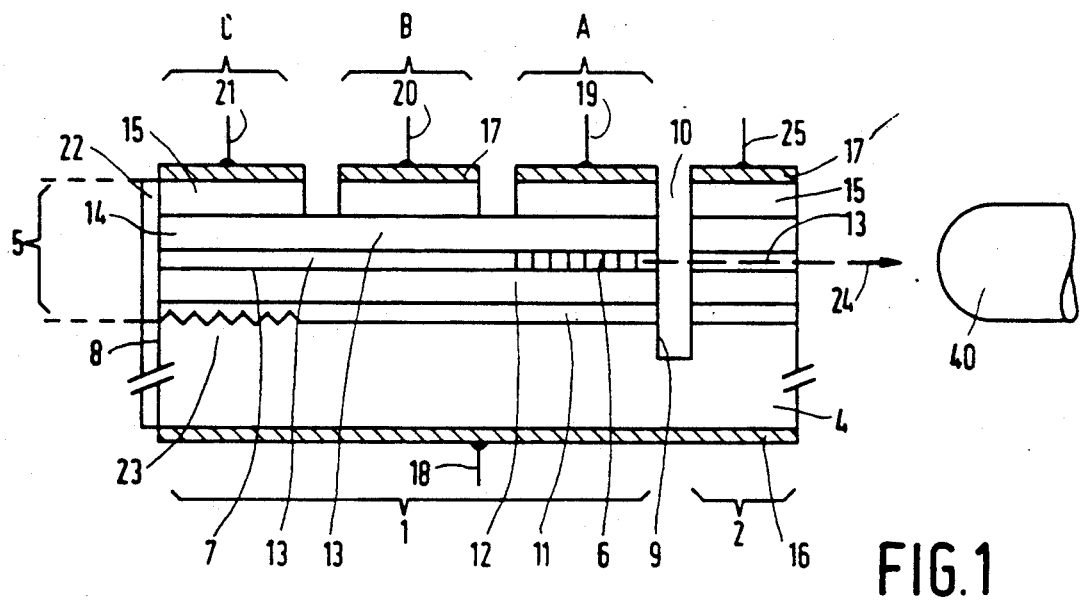
FIG. 1 diagrammatically shows a diode laser with monitor diode according to the invention in cross-section.

FIG. 1 diagrammatically shows in cross-section a semiconductor diode laser 1 with a monitor diode 2 according to the invention. The device comprises a semiconductor body 3 with a substrate region 4 of a first conductivity type and a superimposed semiconductor layer structure 5. The layer structure 5 comprises an active layer 6 and a pn junction 7 with which, provided there is a sufficiently strong current in the forward bias direction of the pn junction, coherent electromagnetic radiation can be generated in a strip-shaped active region of the active layer 6 situated within a resonance cavity. The diode laser 1 is bounded in its longitudinal direction by two end faces 8, 9 which are substantially perpendicular to the active region. The radiation emerges through at least one (9) of these end faces.

The monitor diode 2 is formed by a portion of the semiconductor body 3 which is separated from the diode laser 1 by a groove 10 which extends through the layer structure 5 at least down to the substrate region 4, and of which at least a portion of one of the walls forms and end face 9 of the diode laser. A very good electrical separation (>1 MOhm) between the diode laser and the monitor diode is obtained with this construction.

The layer structure 5 in this example consists of a first radiation guiding layer 11, a first passive layer 12, the active layer 6 (below A), a second radiation guiding layer 13 (below B, C and in 2), a second passive layer 14, and a contact layer 15 of the second conductivity type. Depending on the manufacturing method, a so-called "anti-melt back layer" is also present between the layers 6 and 14. The pn junction 7 is present, depending on the conductivity type of the layers 6 and 13 (in this example slightly p-type), at the boundary of these layers with the layer 12 or with the layer 14. An anti-reflection coating 22 is provided on the end face 8.

At the area of the section C (see below) the substrate 4 has a periodic thickness variation 23. This forms a grating structure by which a portion of the generated radiation is reflected. In fact, in the present example the diode laser is a tunable semiconductor diode laser of the DBR (Distributed Bragg Reflector) type. Such a diode laser and its manufacture are described in detail in the Netherlands Patent Application no. 89203139.4 published Jun. 27, 1990, priority date Dec. 16, 1988, U.S. Ser. No. 445740, the contents of which are to be regarded as being included in the present document by way of reference. These matters will accordingly not be described in full detail here.

The laser comprises a contact layer 15 of the second, p conductivity type. This layer 15 and the substrate region 4 are electrically connected (via the intermediate semiconductor regions) to metal layers 16, 17 provided on the upper and the lower surface, which serve as connection conductors. The metal layer 16 is provided with an electrical connection 18, the metal layer 17 and the contact layer 15 are subdivided into three sections, i.e. the active section A, the phase section B, and the Bragg section C, which are mutually separated by two grooves interposed between the sections and reaching down to the second passive layer 14. The sections A, B, C are provided with electrical connections 19, 20, 21. The current in the first section A, where the electromagnetic radiation is generated, can be set via connections 19, 18. The current running through the sections B and C, i.e. through the phase section and the Bragg section, can be set via the connections 18 and 20, and 18 and 21, so that the refractive index in these sections can be set. The laser may be tuned continuously or stepwise in that the current through the phase and Bragg sections is varied continuously or stepwise.

The substrate 4 and the first passive layer 12 in this example consist of n-type indium phosphide. The second passive layer 14 consists of p-type indium phosphide. The other layers are made of indium-gallium-arsenic phosphide ($In_xGa_{1-x}As_yP_{1-y}$). The values of x and y for the radiation guiding layers 11 and 13 and for the contact layer 15 are: x=0.72 and y=0.60; and for the active layer 6: x=0.57 and y=0.91. The layer 12 is n-type conducting, the contact layer 15 and the layer 14 are p-type conducting, the other layers are not purposely doped.

According to the invention, the groove 10 and the monitor diode 2 are present at the side where the main radiation beam 24 emerges, while the active layer 6 extends at most over only a small portion of the length of the monitor diode 2.

In this embodiment the active layer 6 does not extend within the monitor diode 2 at all, so that the radiation beam 24 after leaving the laser does not traverse the material of this layer 6 anymore and is absorbed to a comparatively low degree in the light guiding layer 13, which has a slightly greater band gap than the layer 6. As a result, the radiation 24 can be coupled to the optical fiber 40 positioned behind the monitor diode without substantial losses. The length of the monitor diode is approximately 60 $\mu$m, which is less than the absorption length for the generated radiation in the layer 13, which absorption length in the present case is approximately 500 $\mu$m.

The thickness of the layer 11 is, for example: 0.2 $\mu$m, that of the layer 12: 0.1 $\mu$m, of the layers 6 and 13: 0.2 $\mu$m, of the layer 14: 0.8 $\mu$m, and of the layer 15: 0.5 $\mu$m.

The groove 10 in this embodiment has a width of 1.5 $\mu$m and may be provided by the use of the known RIE (Reactive Ion Etching) technique. The width of the groove is preferably taken to be as small as possible and is at most a few wavelengths of the emitted radiation. The width of the strip-shaped active region is, for example, 0.9 $\mu$m. This strip-shaped region may be laterally bounded in various ways, for example, by means of buried layers and/or grooves, as is the case in the known DCPHB (Double Channel Planar Buried Heterostructure) laser structure. The method of lateral bounding is immaterial to the invention.

For the manufacture of the entire layer structure, in particular as regards the local provision of the active layer 6, reference is made to the said published Netherlands Application No. 89203139.4.

The monitor diode comprises only portions of the layers 4, 11, 12, 13, 14 and 15, as is apparent from FIG. 1, and is provided with a connection 25 to the contact layer 15 on the metal layer 17. The monitor diode is generally reverse biased, and the feedback signal desired for controlling the laser current may be obtained between the contacts 18 and 25 across a load.

The forbidden band gap (1.008 eV) of the layer 13 is only slightly greater than the energy (0.953 eV) of the emitted 1.3 $\mu$m radiation 24. It is found that the small amount of energy absorbed thereby is sufficient for generating a suitable feedback signal for controlling the laser. Since the monitor diode is positioned in the main radiation beam, the radiation to be used is monitored in a direct way. Furthermore, the monitor diode is automatically aligned relative to the laser beam since it is built up from the same layer structure as the diode laser.

According to another, slightly different preferred embodiment, the active layer 6 is not entirely absent in the monitor diode, but it extends within the monitor diode over such a small length that only a small percentage of the laser radiation is absorbed. See FIG. 2, for example, which shows a cross-section of a different device according to the invention in which the active layer 6 extends over only a small portion, less than 20%, of the monitor diode length.

The active layer could alternatively extend over the entire monitor diode length, i.e. when the monitor diode itself is so short that the length over which absorption occurs is nevertheless smaller than the absorption length of the generated radiation in the material of the layer 6. In that case, however, the length of the monitor diode will usually be so small as to be unpracticable.

Figure 3:
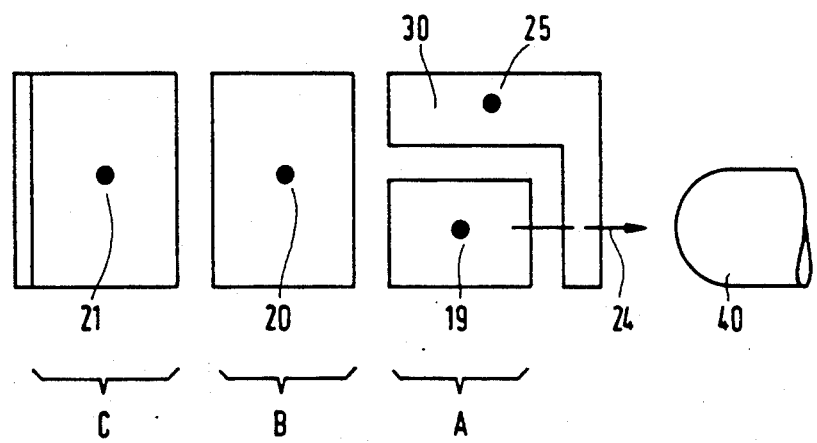
FIG. 3 diagrammatically shows a third device according to the invention in plan view.

The provision of the contact 25 at the upper side of the monitor diode may present a problem in the case of a small monitor diode length because of the small dimensions of the upper surface. A construction of which the upper surface is represented in FIG. 3 presents a solution to this problem.

Figure 2:
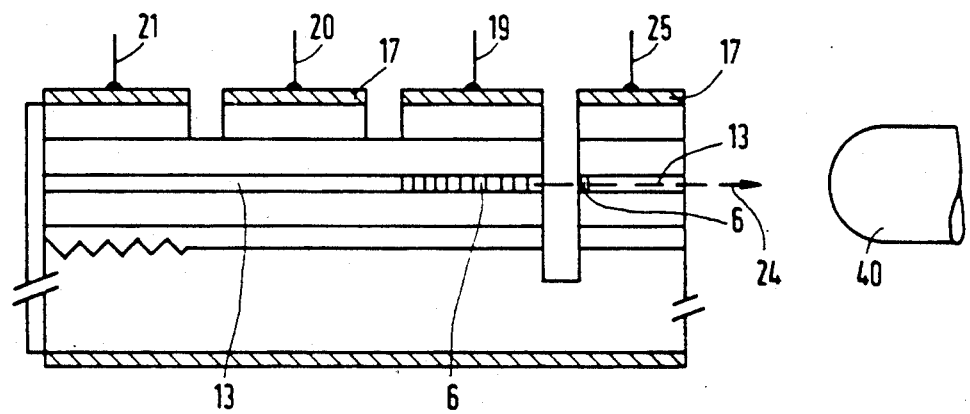
FIG. 2 diagrammatically shows another device according to the invention in cross-section.

This structure looks more or less like FIGS. 1 or 2 in a cross-section through the center. As can be seen in FIG. 3, however, the groove here does not run over the entire width of the device, but it runs partly in the longitudinal direction of the diode laser, thus bounding a portion 30 of the monitor diode on which ample space is available for the connection contact 25. The invention is not limited to the embodiments given here. Many variations are possible for those skilled in the art within the scope of the invention. Thus, instead of the tunable semiconductor diode lasers described here, other laser structures may be used, either tunable or non-tunable, either of the DBR or DFB type, or of the Fabry-Pérot type. Furthermore, the sequence of the active section (A), the phase section (B), and the Bragg section (C) may be changed in the diode lasers given in the examples. Thus it may be advantageous for the active section to be located between the Bragg section and the phase section, so that the active section is not intersected by the groove. If so desired, the Bragg section (C) may also be situated between the active section (A) and the phase section (B) instead of at the end, and other layer thicknesses, conductivity types, and dopings may be used. In general, the invention can be applied to all forms of semiconductor diode lasers having a layer structure.

We claim:

1. A semiconductor diode laser with a monitor diode, comprising a semiconductor body with a substrate region and a superimposed semiconductor layer structure comprising a active layer and a pn junction with which, upon providing a sufficiently strong current in the forward bias direction of the pn junction, coherent electromagnetic radiation is generated in a strip-shaped active region of the active layer situated within a resonance cavity, which resonance cavity is bounded by two end faces which are substantially perpendicular to the active region, the radiation emerging through at least one of the end faces, the monitor diode being formed by a portion of the semiconductor body which is separated from the diode laser by a groove which extends through the layer structure down to at least the substrate region and of which one of the walls forms an end face of the diode laser, characterized in that the groove and the monitor diode are provided at the side where the main radiation beam emerges and in that the active layer extends over at most only a small portion of the length of the monitor diode.

2. A semiconductor diode laser as claimed in claim 1, characterized in that the length in the monitor diode over which absorption occurs is smaller than the absorption length for the laser radiation emitted.

3. A semiconductor diode laser as claimed in claim 1, characterized in that the active layer extends over at most 20% of the length of the monitor diode.

4. A semiconductor diode laser as claimed in claim 1, characterized in that the active layer does not extend inside the monitor diode.

5. A semiconductor diode laser as claimed in claim 1, characterized in that the groove runs partly in the longitudinal direction of the diode laser and bounds a portion of the monitor diode on which a connection conductor is provided.

6. A semiconductor diode laser as claimed in claim 1, characterized in that the diode laser is a tunable laser of the DBR (Distributed Bragg Reflector) type.

* * * * *